(12) United States Patent
Sato

(10) Patent No.: US 8,207,565 B2
(45) Date of Patent: Jun. 26, 2012

(54) SEMICONDUCTOR DEVICE AND METHOD FOR MANUFACTURING SAME

(75) Inventor: Koichi Sato, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 93 days.

(21) Appl. No.: 12/623,281

(22) Filed: Nov. 20, 2009

(65) Prior Publication Data

US 2011/0001182 A1    Jan. 6, 2011

(30) Foreign Application Priority Data

Jul. 1, 2009  (JP) ................. 2009-156585

(51) Int. Cl.
*H01L 27/108* (2006.01)
(52) U.S. Cl. ........ 257/301; 257/296; 257/303; 257/306; 257/E27.016
(58) Field of Classification Search .................. 257/296, 257/301, 303, 306
See application file for complete search history.

(56) References Cited

U.S. PATENT DOCUMENTS

| | | | |
|---|---|---|---|
| 2006/0054959 A1* | 3/2006 | Mauder et al. | 257/301 |
| 2008/0173920 A1* | 7/2008 | Juengling | 257/306 |
| 2008/0316675 A1* | 12/2008 | Hintze et al. | 361/311 |

FOREIGN PATENT DOCUMENTS

JP     2007-266143    10/2007

OTHER PUBLICATIONS

Kim, J. et al., Novel 3-D Structure for Ultra High Density Flash Memory with VRAT (Vertical-Recess-Array-Transistor) and PIPE ( Planarized Integration on the same PlanE), 2008 Symposium on VLSI Technology Digest of Technical Papers, pp. 122-123, (2008).

* cited by examiner

*Primary Examiner* — Wai Sing Louie
(74) *Attorney, Agent, or Firm* — Finnegan, Henderson, Farabow, Garrett & Dunner, L.L.P.

(57) ABSTRACT

A semiconductor device includes: a stacked body including a conductive layer and an insulating layer alternately stacked on a base body; a pair of wall portions formed on the base body with a height equivalent to or larger than a thickness of the stacked body and opposed with a spacing wider than a thickness for one layer of the conductive layer; a contact layer interposed between the wall portions and connected to the conductive layer in the stacked body through an open end between the wall portions; and a contact electrode provided on the contact layer and connected to the contact layer.

14 Claims, 11 Drawing Sheets

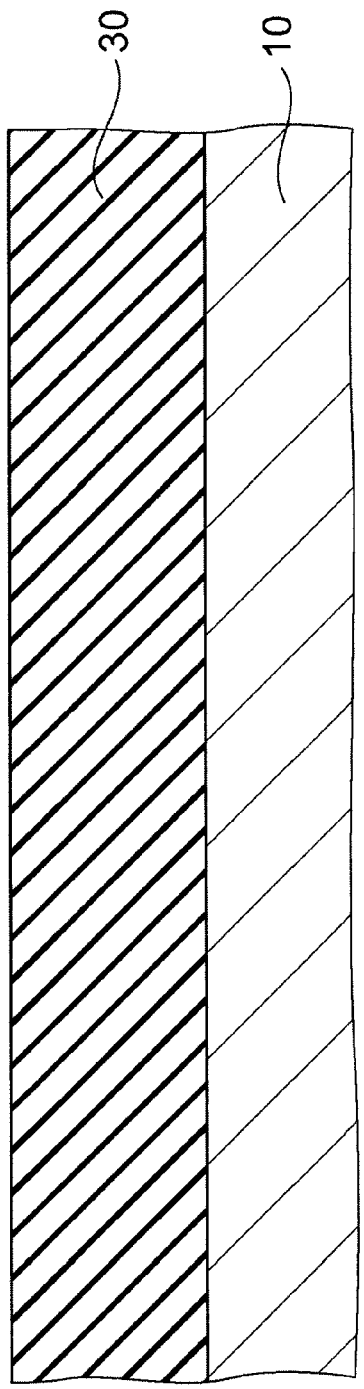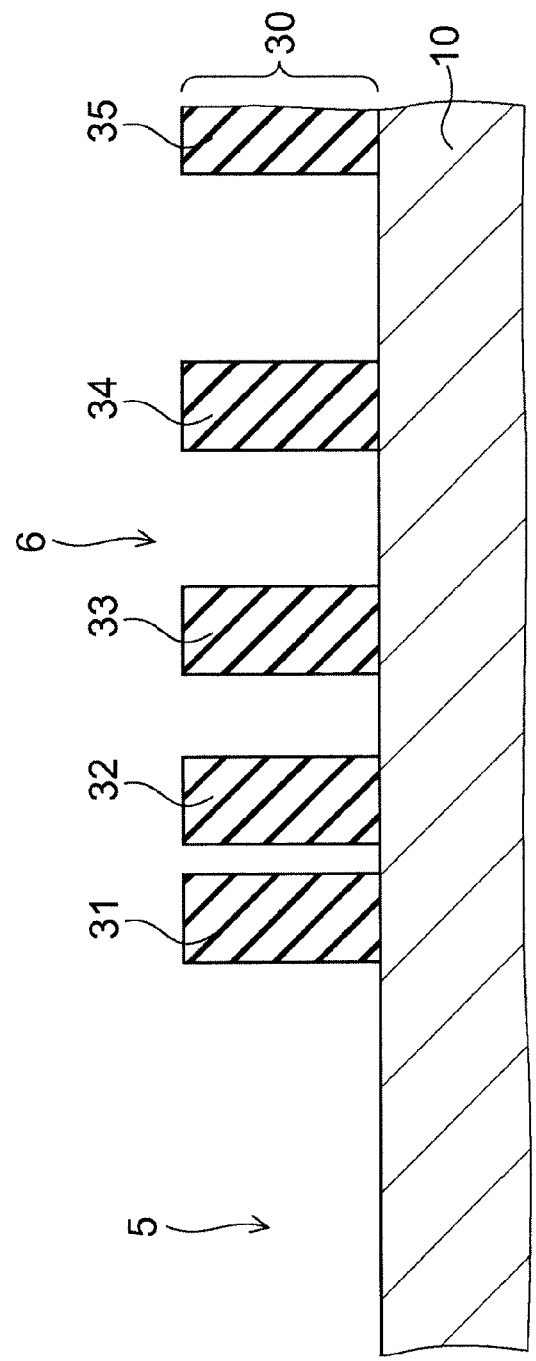
FIG. 3A
FIG. 3B

US 8,207,565 B2

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2009-156585, filed on Jul. 1, 2009; the entire contents of which are incorporated herein by reference.

BACKGROUND OF THE INVENTION

1. Field of the Invention

This invention relates to a semiconductor device and a method for manufacturing the same.

2. Background Art

A technique for three-dimensionally arranging memory cells is proposed in, for instance, JP-A 2007-266143 (Kokai). In this technique, a plurality of conductive layers, each functioning as a word electrode or control gate in a memory device, and insulating layers are alternately stacked into a stacked structure. Through holes (memory holes) are formed in the stacked structure, and a charge storage layer is formed on the inner wall of the hole, in which silicon is subsequently buried in a columnar shape.

Furthermore, in the technique disclosed in JP-A 2007-266143 (Kokai), the end portions of the conductive layers are formed into a staircase shape, and each conductive layer is connected to an upper interconnect in the staircase-shaped portion. In this structure, each contact hole connecting the conductive layer to the upper interconnect has a different depth depending on the depth position of the corresponding conductive layer. Thus, in the case of simultaneously and collectively forming the contact holes, there is concern about process controllability, such as the difficulty of controlling the amount of etching of each contact hole.

SUMMARY OF THE INVENTION

According to an aspect of the invention, there is provided a semiconductor device including: a base body; a stacked body including a conductive layer and an insulating layer alternately stacked on the base body; a pair of wall portions formed on the base body with a height equivalent to or larger than a thickness of the stacked body and opposed with a spacing wider than a thickness for one layer of the conductive layer; a contact layer interposed between the wall portions and connected to the conductive layer in the stacked body through an open end between the wall portions; and a contact electrode provided on the contact layer and connected to the contact layer.

According to another aspect of the invention, there is provided a method for manufacturing a semiconductor device, including: providing n pairs of wall portions opposed with prescribed spacings on a base body, where n is a natural number; alternately stacking n layers of a conductive layer and n layers of an insulating layer on the base body including a region provided with the wall portions, forming a stacked body with the conductive layer and the insulating layer alternately stacked on the base body outside the region provided with the wall portions, and forming the conductive layer and the insulating layer on the region provided with the wall portions so as to cover the wall portions; and removing the conductive layer and the insulating layer above the wall portions to expose the n layers of the conductive layer correspondingly buried between the respective n pairs of wall portions.

BRIEF DESCRIPTION OF THE DRAWINGS

FIGS. 3A and 3B are schematic cross-sectional views illustrating a method for forming a contact structure of a conductive layer of the memory cell array;

DETAILED DESCRIPTION OF THE INVENTION

An embodiment of the invention will now be described with reference to the drawings. Although the semiconductor is illustratively silicon in the following embodiment, semiconductors other than silicon can also be used.

Figure 1:
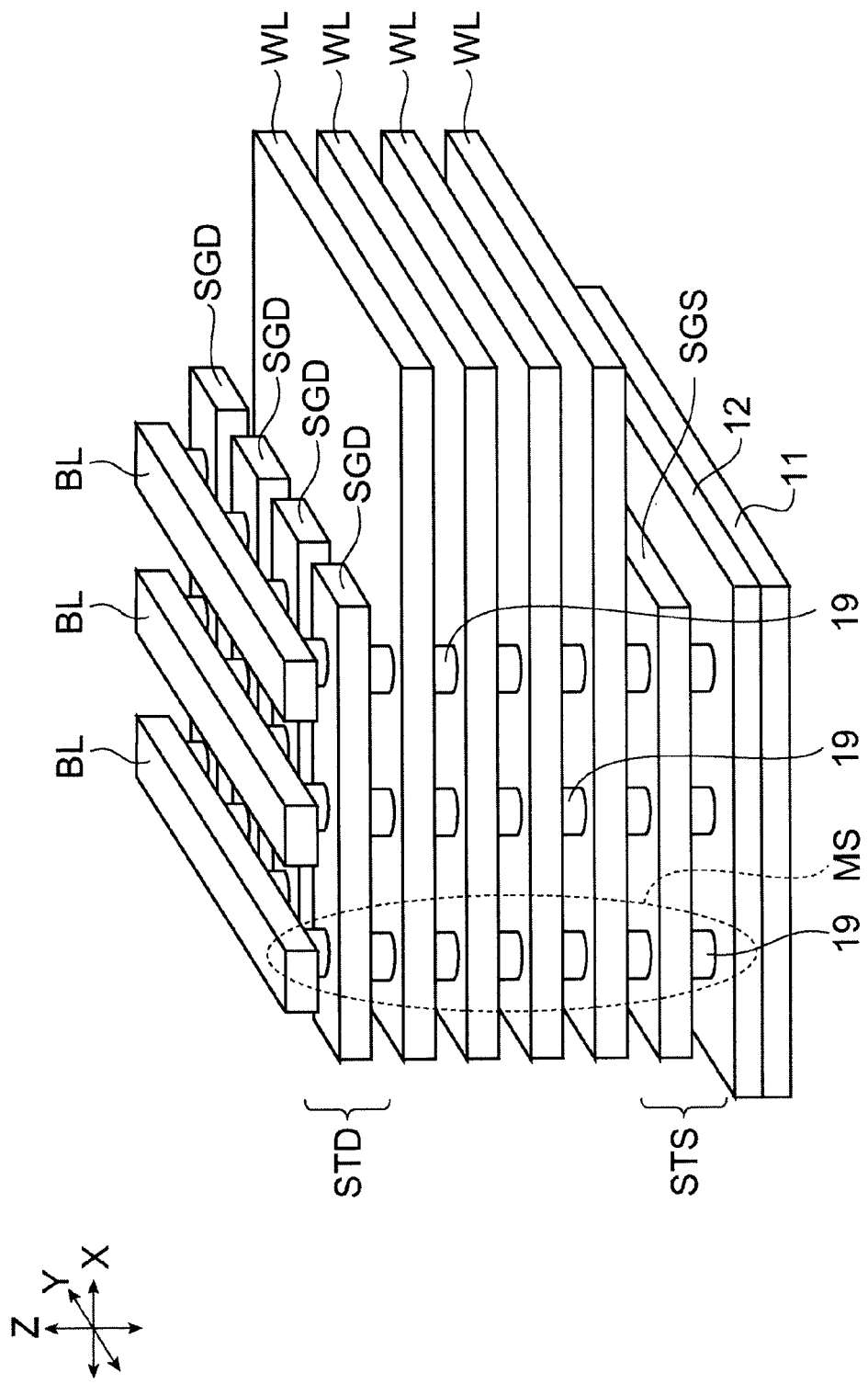
FIG. 1 is a schematic perspective view illustrating the configuration of a memory cell array in a semiconductor device according to an embodiment of the invention.

The semiconductor device according to the embodiment of the invention includes a memory cell array with a plurality of memory cells three-dimensionally arranged therein. FIG. 1 is a schematic perspective view illustrating the configuration of the memory cell array.

In FIG. 1, for clarity of illustration, only the conductive portions are shown, and the insulating portions are not shown. Furthermore, in FIG. 1, an XYZ orthogonal coordinate system is introduced for convenience of description. In this coordinate system, the two directions parallel to the major surface of a substrate 11 and orthogonal to each other are referred to as the X and Y directions, and the direction orthogonal to both the X and Y directions, that is, the stacking direction of the plurality of conductive layers WL1-WL4, is referred to as the Z direction.

A source layer 12 is provided on the substrate (such as a silicon substrate) 11. A source-side select gate (or lower select gate) SGS is provided above the source layer 12 via an insulating layer. The source layer 12 and the source-side select gate SGS are silicon layers doped with impurities and being conductive.

An insulating layer is provided on the source-side select gate SGS, and on the insulating layer is provided a stacked body in which a plurality of conductive layers WL and a plurality of insulating layers are alternately stacked. The number of conductive layers WL is arbitrary, and illustratively four in FIG. 1. The conductive layer WL is a silicon layer doped with impurities and being conductive.

An insulating layer is provided on the uppermost conductive layer WL, and a drain-side select gate (or upper select gate) SGD is provided on the insulating layer. The drain-side select gate SGD is a silicon layer doped with impurities and being conductive.

The conductive layers WL, the source-side select gate SGS, and the source layer 12 are formed as plate-like layers generally parallel to the XY plane. The drain-side select gate SGD is formed into a plurality of wiring-like conductive members extending in the X direction.

The aforementioned stacked body on the substrate 11 includes a plurality of memory holes extending in the Z direction, and the memory holes are arranged in a matrix illustratively along the X and Y directions. Inside each of the memory holes, a silicon pillar 19 is buried as a columnar semiconductor layer. The silicon pillar 19 penetrates through the drain-side select gate SGD, the conductive layers WL, and the source-side select gate SGS. The silicon pillar 19 is shaped like a column, such as a cylinder, extending in the Z direction. The lower end of the silicon pillar 19 is connected to the source layer 12.

An insulating layer is provided on the drain-side select gate SGD, and a plurality of bit lines BL extending in the Y direction are provided on the insulating layer. Each of the bit lines BL is arranged so as to pass immediately above each corresponding sequence of the silicon pillars 19 arranged along the Y direction, and is connected to the upper end of the silicon pillars 19.

As many memory cells as the number of conductive layers WL are series connected in the Z direction around one silicon pillar 19 to constitute one memory string MS. Such memory strings MS are arranged in a matrix in the X and Y directions, and thereby a plurality of memory cells MC are three-dimensionally arranged in the X, Y, and Z directions.

Figure 2:
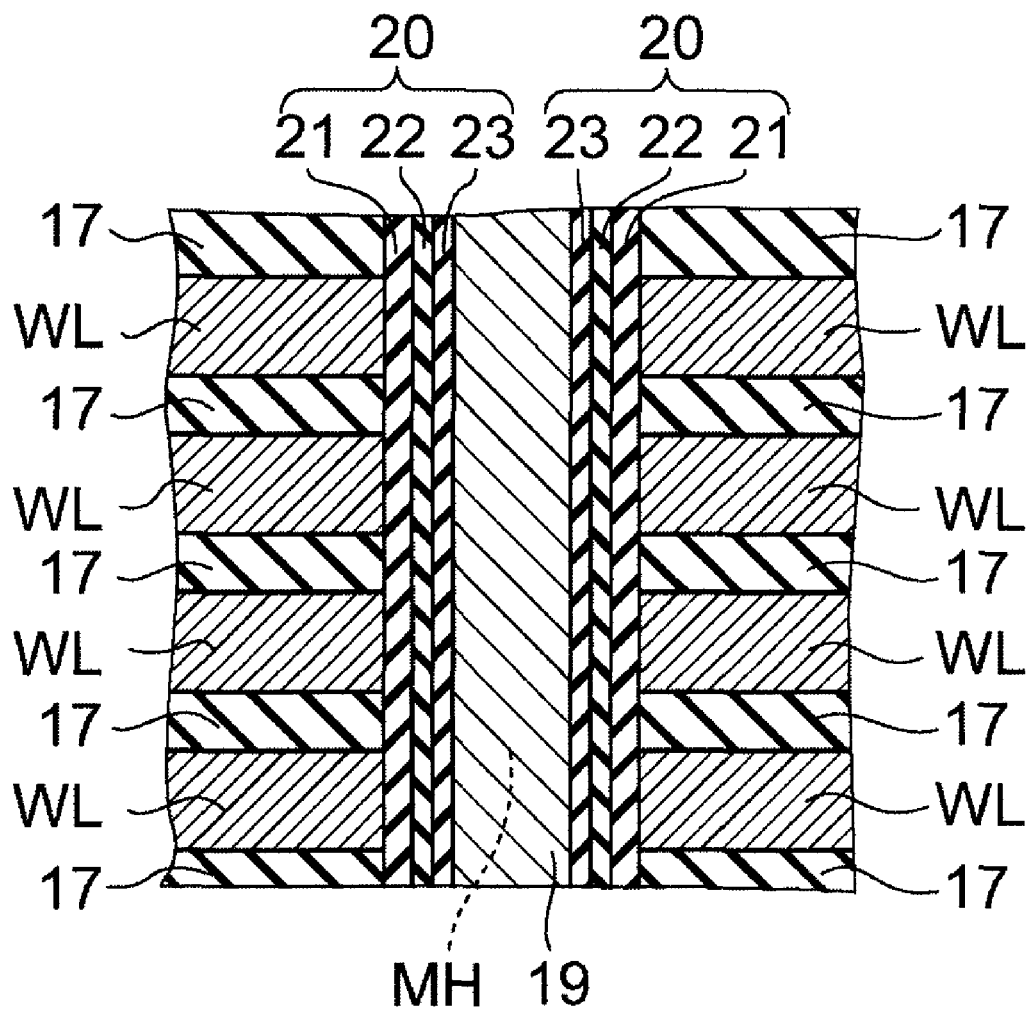
FIG. 2 is an enlarged cross-sectional view of the portion of the memory cells.

FIG. 2 is an enlarged cross-sectional view of a portion including memory cells.

An insulating layer 17 illustratively containing silicon oxide is provided between each conductive layer WL. On the inner peripheral wall of the memory hole MH formed in the stacked body of these conductive layers WL and insulating layers 17 is formed an insulating film 20 illustratively having an ONO (oxide-nitride-oxide) structure in which a silicon nitride film is sandwiched between a pair of silicon oxide films.

The insulating film 20 has a structure in which a charge storage layer 22 is sandwiched between a first insulating film 21 and a second insulating film 23. The silicon pillar 19 is provided inside the second insulating film 23, and the second insulating film 23 is in contact with the silicon pillar 19. The first insulating film 21 is provided in contact with the conductive layers WL1-WL4, and the charge storage layer 22 is provided between the first insulating film 21 and the second insulating film 23.

The silicon pillar 19 provided in the stacked body of the conductive layers. WL and the insulating layers 17 functions as a channel, each of the conductive layers WL functions as a control gate, and the charge storage layer 22 functions as a data memory layer for storing charges injected from the silicon pillar 19. That is, at the intersection between the silicon pillar 19 and each of the conductive layers WL is formed a memory cell having a structure in which a channel is surrounded by a control gate.

This memory cell is a memory cell having a charge trap structure. The charge storage layer 22 includes numerous traps operable to confine charges (electrons), and is illustratively made of a silicon nitride film. The second insulating film 23 is illustratively made of a silicon oxide film and serves as a potential barrier when a charge is injected from the silicon pillar 19 into the charge storage layer 22 or when a charge stored in the charge storage layer 22 diffuses into the silicon pillar 19. The first insulating film 21 is illustratively made of a silicon oxide film and prevents charges stored in the charge storage layer 22 from diffusing into the conductive layers WL.

Referring again to FIG. 1, on the inner peripheral wall of the hole formed in the stacked body composed of the source-side select gate SGS and its overlying and underlying insulating layer, a gate insulating film, not shown, is formed in a tubular shape, and the silicon pillar 19 is buried therein. Thus, this stacked body includes a source-side select transistor STS with the silicon pillar 19 serving as a channel and the source-side select gate SGS therearound serving as a gate electrode.

On the inner peripheral wall of the hole formed in the stacked body composed of the drain-side select gate SGD and its overlying and underlying insulating layer, a gate insulating film, not shown, is formed in a tubular shape, and the silicon pillar 19 is buried therein. Thus, this stacked body includes a drain-side select transistor STD with the silicon pillar 19 serving as a channel and the drain-side select gate SGD therearound serving as a gate electrode.

Around the memory cell array described above, a peripheral circuit, not shown, is formed in the same substrate 11. The peripheral circuit illustratively includes a driver circuit for applying a potential to the upper end portion of the silicon pillar 19 through a bit line BL, a driver circuit for applying a potential to the lower end portion of the silicon pillar 19 through the source layer 12, a driver circuit for applying a potential to the drain-side select gate SGD, a driver circuit for applying a potential to the source-side select gate SGS, and a driver circuit for applying a potential to each of the conductive layers WL.

The semiconductor device according to this embodiment is a nonvolatile semiconductor memory device enabling data to be erased and programmed electrically and freely, and being capable of retaining its memory content even when powered off.

The X coordinate of a memory cell is selected by selecting a bit line BL, the Y coordinate of the memory cell is selected by selecting a drain-side select gate SGD to turn the drain-side select transistor STD to the conducting or non-conducting state, and the Z coordinate of the memory cell is selected by selecting a conductive layer WL. Then, data is stored by injecting electrons into the charge storage layer 22 of the selected memory cell. The data stored in the memory cell is read by passing a sense current in the silicon pillar 19, which passes through the memory cell.

Each conductive layer WL is connected to a corresponding word line through a contact layer. FIG. 6B is a cross-sectional view of a contact region 6 including the contact layer. FIG. 7 is a plan view corresponding to FIG. 6B where the stopper film 40, the interlayer insulating film 50, and the contact electrodes 61-64 are removed.

The structure including the substrate 11, the source layer 12, and the source-side select transistor STS in FIG. 1 is shown as a base body 10 in FIG. 6B. A memory cell region 5 illustratively includes eight conductive layers WL1-WL8 and eight insulating layers 17a-17h.

On the base body 10 of the contact region 6, n pairs of wall portions 31-35 opposed with prescribed spacings are provided, where n denotes the same number as the number of conductive layers WL1-WL8 stacked in the memory cell region 5. That is, eight pairs of wall portions are provided in the contact region 6. FIGS. 6B and 7 show only five wall portions 31-35 (four pairs of wall portions).

Each of the wall portions 31-35 is made of an insulator such as silicon oxide. The heights of the wall portions 31-35 are generally equal with reference to the surface of the base body 10, and generally equal to or larger than the thickness of the stacked body of the conductive layers WL1-WL8 and the insulating layers 17a-17h stacked in the memory cell region 5.

Each of the conductive layers WL1-WL8 stacked in the memory cell region 5 has generally the same thickness. Furthermore, each of the insulating layers 17a-17h stacked in the memory cell region 5 also have generally the same thickness. As shown in FIG. 7, each of the wall portions 31-35 is opposed generally in parallel. The spacings between the opposed surfaces of each of the wall portions 31-35 are different from each other. The spacing between the wall portion 31 and the wall portion 32 is the narrowest, and it is wider than the thickness for one layer of the conductive layers WL1-WL8 provided in the memory cell region 5.

A contact layer 41 is provided between the wall portion 31 and the wall portion 32. The contact layer 41 is provided like a column extending along the height of the wall portions 31 and 32. As described later, the contact layer 41 is formed from the same material and at the same time as the lowermost conductive layer WL1 is formed in the memory cell region 5.

Before the conductive layers WL1-WL8 are provided, both ends of the space between the wall portion 31 and the wall portion 32 (upper and lower end in FIG. 7) are not closed, but are open ends. Through those open ends, the contact layer 41 is electrically connected to the lowermost conductive layer WL1 in the memory cell region 5. Furthermore, both ends of the space between the other opposed wall portions are also open ends.

A conductive layer WL1, an insulating layer 17a, and a contact layer 42 are provided between the wall portion 32 and the wall portion 33, which have a wider spacing than the spacing between the wall portion 31 and the wall portion 32. The conductive layer WL1 is provided on the opposed surfaces of the wall portions 32 and 33, the insulating layer 17a is provided inside it, and the contact layer 42 is provided inside it. The contact layer 42 is provided like a column extending along the height of the wall portions 32 and 33. The contact layer 42 is formed from the same material and at the same time as the second lowest conductive layer WL2 is formed in the memory cell region 5, and is electrically connected to the conductive layer WL2 through the open ends between the wall portions 32 and 33.

A conductive layer WL1, an insulating layer 17a, a conductive layer WL2, an insulating layer 17b, and a contact layer 43 are provided between the wall portion 33 and the wall portion 34, which have a still wider spacing than the spacing between the wall portion 32 and the wall portion 33. The conductive layer WL1 is provided on the opposed surfaces of the wall portions 33 and 34, the insulating layer 17a is provided inside it, the conductive layer WL2 is provided inside it, the insulating layer 17b is provided inside it, and the contact layer 43 is provided inside it. The contact layer 43 is provided like a column extending along the height of the wall portions 33 and 34. The contact layer 43 is formed from the same material and at the same time as the third lowest conductive layer WL3 is formed in the memory cell region 5, and is electrically connected to the conductive layer WL3 through the open ends between the wall portions 33 and 34.

A conductive layer WL1, an insulating layer 17a, a conductive layer WL2, an insulating layer 17b, a conductive layer WL3, an insulating layer 17c, and a contact layer 44 are provided between the wall portion 34 and the wall portion 35, which have a still wider spacing than the spacing between the wall portion 33 and the wall portion 34. The conductive layer WL1 is provided on the opposed surfaces of the wall portions 34 and 35, the insulating layer 17a is provided inside it, the conductive layer WL2 is provided inside it, the insulating layer 17b is provided inside it, the conductive layer WL3 is provided inside it, the insulating layer 17c is provided inside it, and the contact layer 44 is provided inside it. The contact layer 44 is provided like a column extending along the height of the wall portions 34 and 35. The contact layer 44 is formed from the same material and at the same time as the fourth lowest conductive layer WL4 is formed in the memory cell region 5, and is electrically connected to the conductive layer WL4 through the open ends between the wall portions 34 and 35.

The fifth and subsequent conductive layers WL5-WL8 can also be considered similarly. That is, as many pairs of wall portions having a still wider spacing than the spacing between the wall portions 34 and 35 including the contact layer 44 are provided as the number of layers (four layers) of the fifth and subsequent conductive layers WL5-WL8, and a contact layer electrically connected to one of the fifth and subsequent conductive layers WL5-WL8 is provided between each pair of wall portions.

Thus, the contact region 6 includes eight pairs of opposed wall portions, which are as many pairs as the number of conductive layers WL1-WL8 in the memory cell region 5, and the spacings between the opposed wall portions are different from each other. The contact layer 41 electrically connected to the lowermost conductive layer WL1 in the memory cell region 5 is interposed between the wall portions 31 and 32 having the narrowest spacing. The contact layer electrically connected to a higher conductive layer in the memory cell region 5 is interposed between those opposed wall portions having a wider spacing.

In FIG. 6B, the upper surfaces of the stacked body in the memory cell region 5 and the structure in the contact region 6 described above are located at generally the same height from the surface of the base body 10. A stopper film 40 is provided on those upper surfaces, and an interlayer insulating film 50 is provided on the stopper film 40. The stopper film 40 is illustratively a silicon nitride film, and the interlayer insulating film 50 is illustratively a silicon oxide film.

Figure 6A:
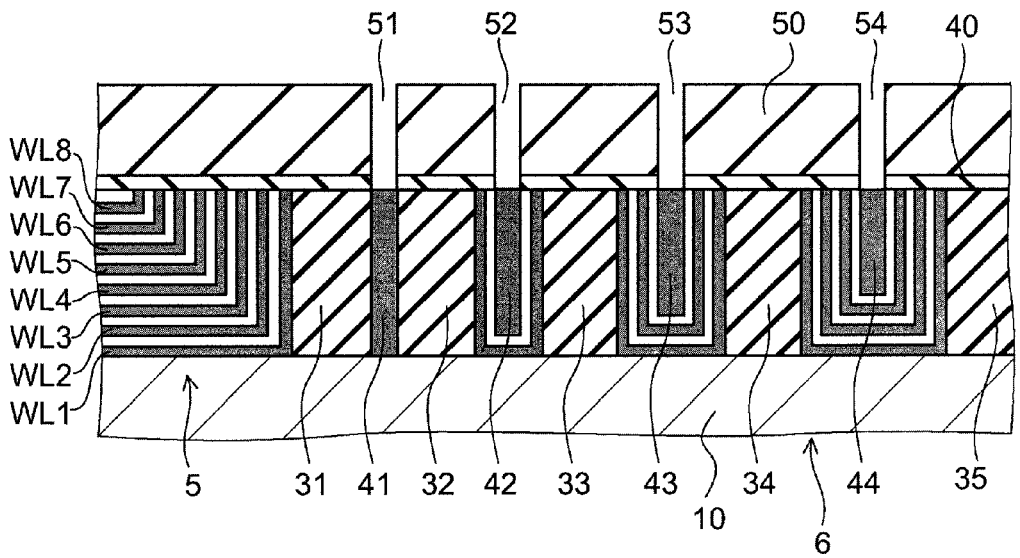
FIGS. 6A and 6B are schematic cross-sectional views in order of the processes, continuing from FIG. 5B.
Figure 6B:
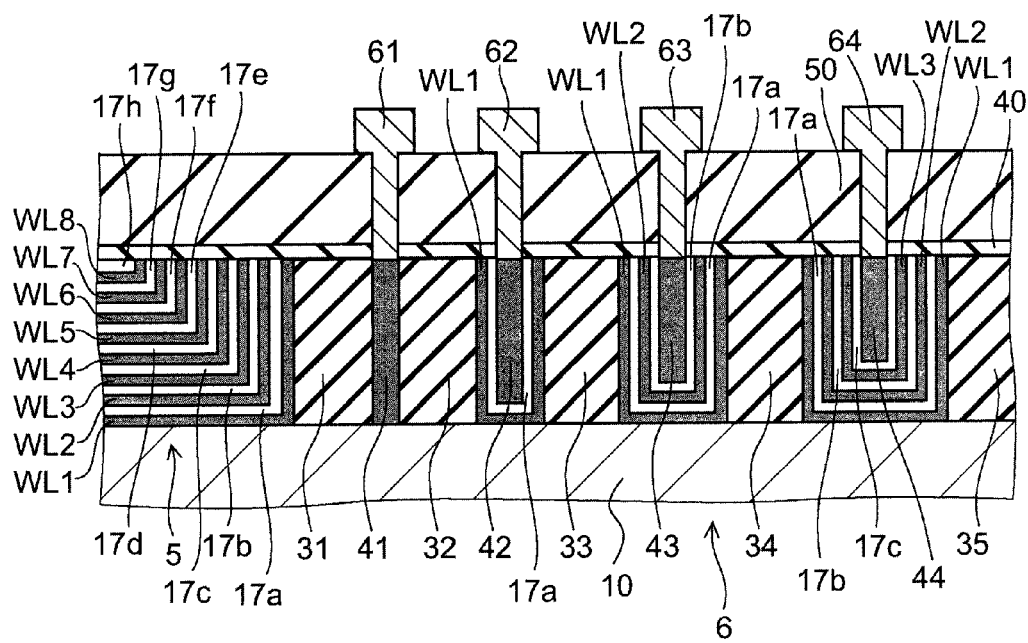
Figure 7:
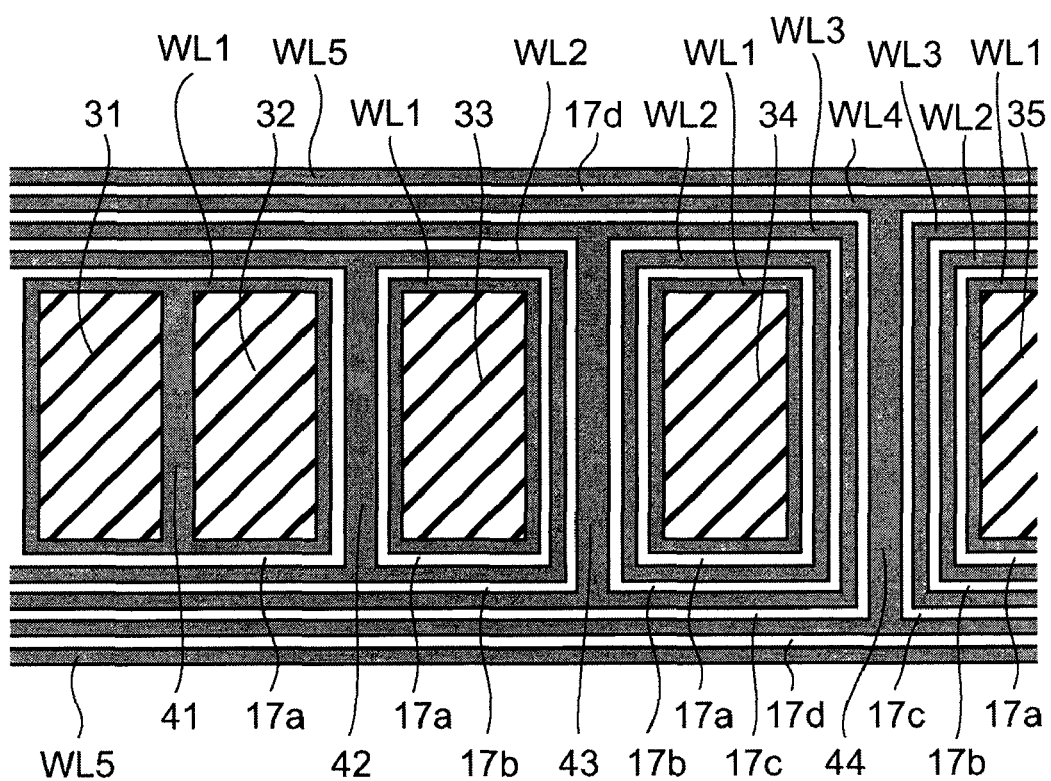
FIG. 7 is a plan view of the contact region showing in FIG. 5A.

Contact holes 51-54 are formed in portions of the stopper film 40 and the interlayer insulating film 50 above the contact layers 41-44, respectively, as shown in FIG. 6A, and contact electrodes 61-64 are provided in the contact holes 51-54 as shown in FIG. 6B. Each of the contact layers 41-44 is electrically connected to the contact electrode 61-64 provided thereabove. Each of the contact electrodes 61-64 is electrically connected to a corresponding word line (not shown).

In this embodiment, as described below, simultaneously with the process of forming the conductive layers WL1-WL8 in the memory cell region 5, the contact layers connected to the conductive layers WL1-WL8 can also be formed collectively.

Next, a method for manufacturing a semiconductor device according to this embodiment is described with reference to FIGS. 3A to 7. Here, the contact region 6 is extracted for description, and the description of the method for forming the memory cell array including the memory cells, the source-side select transistor STS, the drain-side select transistor STD and the like is omitted.

It is assumed that the source-side select transistor STS and transistors and the like in the peripheral circuit have already been formed in the base body 10. On the base body 10, as shown in FIG. 3A, an insulating layer (such as a silicon oxide layer) 30 is formed. The insulating layer 30 is formed on the entire surface of the base body 10.

Next, a resist pattern, not shown, provided on the insulating layer 30 is used as a mask to selectively etch the insulating layer 30. The insulating layer 30 is left only in the contact region 6 as shown in FIG. 3B. The insulating layer 30 left in the contact region 6 constitutes wall portions 31-35.

As described above, n pairs of opposed wall portions are provided, which are as many pairs as the number n of conductive layers formed in the memory cell region 5. In the following, a description is given of an example in which eight conductive layers WL1-WL8 are formed in the memory cell region 5. However, only five wall portions 31-35 (four pairs of wall portions) are shown in FIGS. 3A to 7.

The spacings between the wall portions 31-35 are different from each other. Here, the thickness of each conductive layer WL1-WL8 formed in the memory cell region 5 is denoted by A, and the thickness of each insulating layer 17a-17h is denoted by B. Then, the spacings between the wall portions 31-35 can be set to $2A+(n-1)\times 2(A+B)$ ($n=1, 2, \ldots, 8$). The spacing of $n=1$ is the narrowest, and the spacing of $n=8$ is the widest.

The spacing between the wall portion 31 and the wall portion 32 is 2A from the above relation for $n=1$. That is, the spacing between the wall portion 31 and the wall portion 32, which is the narrowest, is set to twice the thickness A for one layer of the conductive layers WL1-WL8. The other spacings between the wall portions are wider than 2A. For instance, the spacing between the wall portion 32 and the wall portion 33 is $2A+2(A+B)$ from the above relation for $n=2$, and the spacing between the wall portion 33 and the wall portion 34 is $2A+4(A+B)$ from the above relation for $n=3$.

Figure 4:
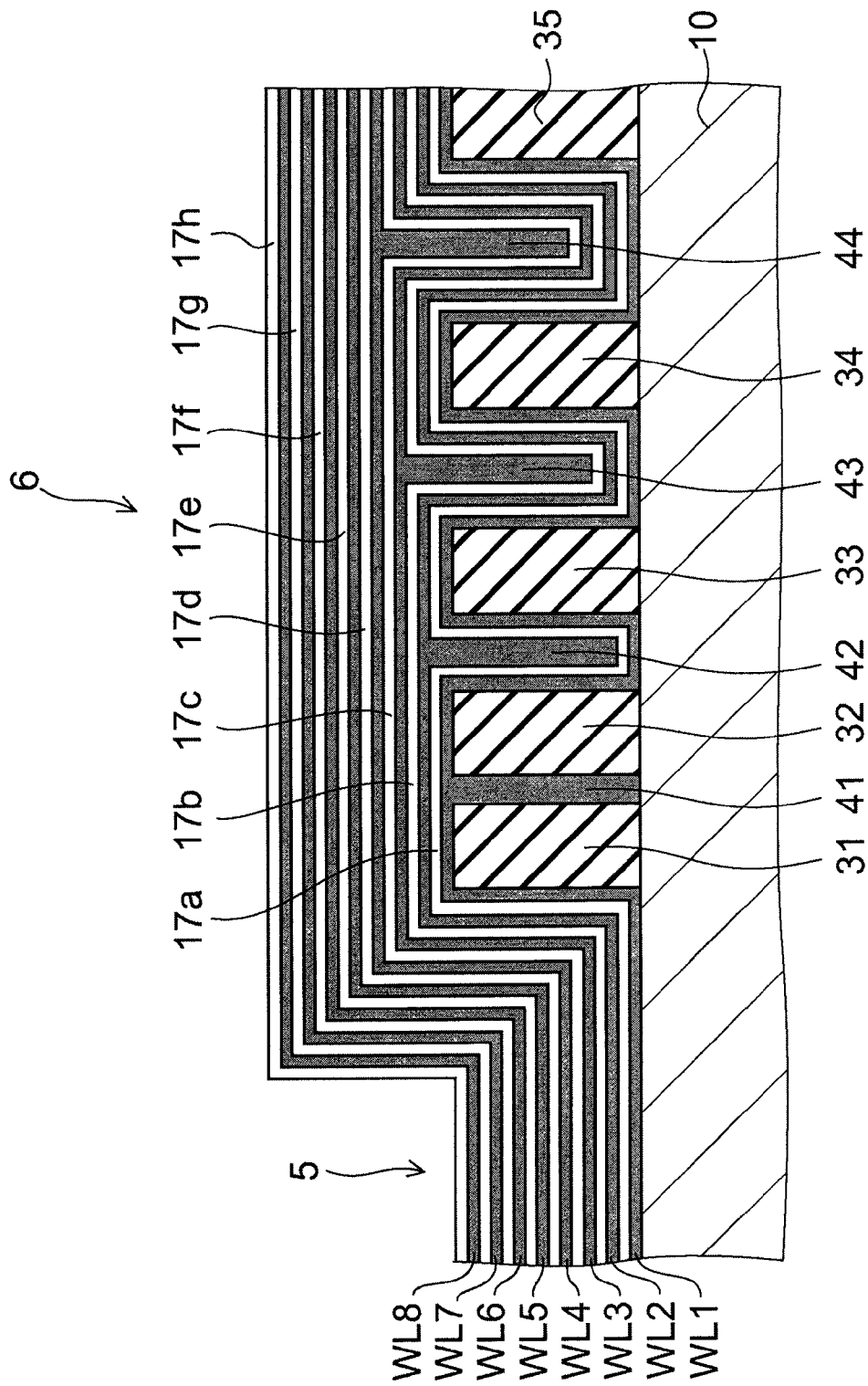
FIG. 4 is a schematic cross-sectional view in order of the processes, continuing from FIG. 3B.

Next, as shown in FIG. 4, conductive layers WL1-WL8 and insulating layers 17a-17h are alternately stacked on the base body 10. The conductive layers WL1-WL8 and the insulating layers 17a-17h are formed illustratively by the CVD (chemical vapor deposition) process.

First, the lowermost (first) conductive layer WL1 is formed. In the memory cell region 5 where the wall portions 31-35 are not provided, the conductive layer WL1 is formed as a film generally parallel to the surface of the base body 10. When the conductive layer WL1 is formed in the memory cell region 5, the conductive layer WL1 is formed in the contact region 6 so as to cover the wall portions 31-35. That is, the upper surface, the opposed surface, which is opposed to the other wall portion, and the side surface (other than the opposed surface) of each of the wall portions 31-35 are covered with the conductive layer WL1.

The thickness of the conductive layer WL1 covering the upper surface, the opposed surface, and the side surface of the wall portions 31-35 is generally equal to the thickness of the conductive layer WL1 formed in the memory cell region 5. However, because the spacing between the wall portion 31 and the wall portion 32, which is the narrowest spacing, is 2A, or twice the thickness A of the conductive layer WL1, the space between the wall portions 31 and 32 is filled with the conductive layer WL1 of thickness A formed on the opposed surface of the wall portion 31 and the conductive layer WL1 of thickness A formed on the opposed surface of the wall portion 32. Hence, the conductive layer WL1 having a width of 2A, or twice the thickness A of the conductive layer WL1, is provided as a contact layer 41 between the wall portion 31 and the wall portion 32. The other spaces between the wall portions having spacing wider than 2A are not completely filled with the first conductive layer WL1.

After the first conductive layer WL1 is formed, a first insulating layer 17a is formed thereon. In the memory cell region 5, the insulating layer 17a is formed as a film generally parallel to the surface of the base body 10. In the contact region 6, the insulating layer 17a is formed so as to cover the conductive layer WL1 formed previously. The thickness of the insulating layer 17a covering the conductive layer WL1 in the contact region 6 is generally equal to the thickness of the insulating layer 17a formed in the memory cell region 5. Here, because the space between the wall portion 31 and the wall portion 32 has been filled with the conductive layer WL1 and left no gap, the insulating layer 17a is not formed between the wall portion 31 and the wall portion 32.

After the first insulating layer 17a is formed, a second conductive layer WL2 is formed thereon. In the memory cell region 5, the conductive layer WL2 is formed as a film generally parallel to the surface of the base body 10. In the contact region 6, the conductive layer WL2 is formed so as to cover the first insulating layer 17a. The thickness of the conductive layer WL2 covering the insulating layer 17a in the contact region 6 is generally equal to the thickness of the conductive layer WL2 formed in the memory cell region 5.

Here, from the aforementioned relation, the spacing between the wall portion 32 and the wall portion 33, which is the second narrowest spacing, is set to $2A+2(A+B)$. Hence, when the first conductive layer WL1 and the first insulating layer 17a have been formed between the wall portion 32 and the wall portion 33, a gap of 2A remains between the wall portion 32 and the wall portion 33. Therefore, when the second conductive layer WL2 is formed, the gap of 2A is filled with the second conductive layer WL2. Thus, the conductive layer WL2 having a width of 2A is provided as a contact layer 42 between the wall portion 32 and the wall portion 33. The other spaces between the wall portions having a spacing wider than the spacing between the wall portion 32 and the wall portion 33 leave a gap wider than 2A when the first insulating layer 17a has been formed, and the gap is not completely filled with the second conductive layer WL2.

After the second conductive layer WL2 is formed, a second insulating layer 17b is formed thereon. In the memory cell region 5, the insulating layer 17b is formed as a film generally parallel to the surface of the base body 10. In the contact region 6, the insulating layer 17b is formed so as to cover the second conductive layer WL2. The thickness of the insulating layer 17b covering the conductive layer WL2 in the contact region 6 is generally equal to the thickness of the insulating layer 17b formed in the memory cell region 5. Here, because the space between the wall portion 32 and the wall portion 33 has no gap, the insulating layer 17b is not formed between the wall portion 32 and the wall portion 33.

After the second insulating layer 17b is formed, a third conductive layer WL3 is formed thereon. In the memory cell region 5, the conductive layer WL3 is formed as a film generally parallel to the surface of the base body 10. In the contact region 6, the conductive layer WL3 is formed so as to cover the second insulating layer 17b. The thickness of the conductive layer WL3 covering the insulating layer 17b in the contact region 6 is generally equal to the thickness of the conductive layer WL3 formed in the memory cell region 5.

Here, from the aforementioned relation, the spacing between the wall portion 33 and the wall portion 34, which is the third narrowest spacing, is set to $2A+4(A+B)$. Hence, when the first conductive layer WL1, the first insulating layer 17a, the second conductive layer WL2, and the second insulating layer 17b have been formed between the wall portion 33 and the wall portion 34, a gap of 2A remains between the wall portion 33 and the wall portion 34. Therefore, when the third conductive layer WL3 is formed, the gap of 2A is filled with the third conductive layer WL3. Thus, the conductive layer WL3 having a width of 2A is provided as a contact layer 43 between the wall portion 33 and the wall portion 34. The other spaces between the wall portions having a spacing wider than the spacing between the wall portion 33 and the wall portion 34 leave a gap wider than 2A when the second insulating layer 17b has been formed, and the gap is not completely filled with the third conductive layer WL3.

After the third conductive layer WL3 is formed, a third insulating layer 17c is formed thereon. In the memory cell region 5, the insulating layer 17c is formed as a film generally parallel to the surface of the base body 10. In the contact region 6, the insulating layer 17c is formed so as to cover the third conductive layer WL3. The thickness of the insulating layer 17c covering the conductive layer WL3 in the contact region 6 is generally equal to the thickness of the insulating layer 17c formed in the memory cell region 5. Here, because the space between the wall portion 33 and the wall portion 34 has no gap, the insulating layer 17c is not formed between the wall portion 33 and the wall portion 34.

After the third insulating layer 17c is formed, a fourth conductive layer WL4 is formed thereon. In the memory cell region 5, the conductive layer WL4 is formed as a film generally parallel to the surface of the base body 10. In the contact region 6, the conductive layer WL4 is formed so as to cover the third insulating layer 17c. The thickness of the conductive layer WL4 covering the insulating layer 17c in the contact region 6 is generally equal to the thickness of the conductive layer WL4 formed in the memory cell region 5.

Here, from the aforementioned relation, the spacing between the wall portion 34 and the wall portion 35, which is the fourth narrowest spacing, is set to 2A+6(A+B). Hence, when the first conductive layer WL1, the first insulating layer 17a, the second conductive layer WL2, the second insulating layer 17b, the third conductive layer WL3, and the third insulating layer 17c have been formed between the wall portion 34 and the wall portion 35, a gap of 2A remains between the wall portion 34 and the wall portion 35. Therefore, when the fourth conductive layer WL4 is formed, the gap of 2A is filled with the fourth conductive layer WL4. Thus, the conductive layer WL4 having a width of 2A is provided as a contact layer 44 between the wall portion 34 and the wall portion 35. The other spaces between the wall portions having a spacing wider than the spacing between the wall portion 34 and the wall portion 35 leave a gap wider than 2A when the third insulating layer 17c has been formed, and the gap is not completely filled with the fourth conductive layer WL4.

Subsequently, in a similar manner, a fourth insulating layer 17d, a fifth conductive layer WL5, a fifth insulating layer 17e, a sixth conductive layer WL6, a sixth insulating layer 17f, a seventh conductive layer WL7, a seventh insulating layer 17g, an eighth conductive layer WL8, and an eighth insulating layer 17h are sequentially formed, and the structure shown in FIG. 4 is obtained.

The space between the wall portions 31 and 32, which is the narrowest, is filled with the contact layer 41 formed simultaneously and integrally with the first conductive layer WL1 in the memory cell region 5. The contact layer 42 formed simultaneously and integrally with the second conductive layer WL2 in the memory cell region 5 is provided midway along the width of the space between the wall portions 32 and 33, which is the second narrowest. The contact layer 43 formed simultaneously and integrally with the third conductive layer WL3 in the memory cell region 5 is provided midway along the width of the space between the wall portions 33 and 34, which is the third narrowest. The contact layer 44 formed simultaneously and integrally with the fourth conductive layer WL4 in the memory cell region 5 is provided midway along the width of the space between the wall portions 34 and 35, which is the fourth narrowest.

Subsequently, although not shown, a contact layer formed simultaneously with the fifth conductive layer WL5 in the memory cell region 5 is provided midway along the width of the fifth narrowest space between the wall portions. A contact layer formed simultaneously with the sixth conductive layer WL6 in the memory cell region 5 is provided midway along the width of the sixth narrowest space between the wall portions. A contact layer formed simultaneously with the seventh conductive layer WL7 in the memory cell region 5 is provided midway along the width of the seventh narrowest space between the wall portions. A contact layer formed simultaneously with the eighth (uppermost) conductive layer WL8 in the memory cell region 5 is provided midway along the width of the widest space between the wall portions.

Figure 5A:
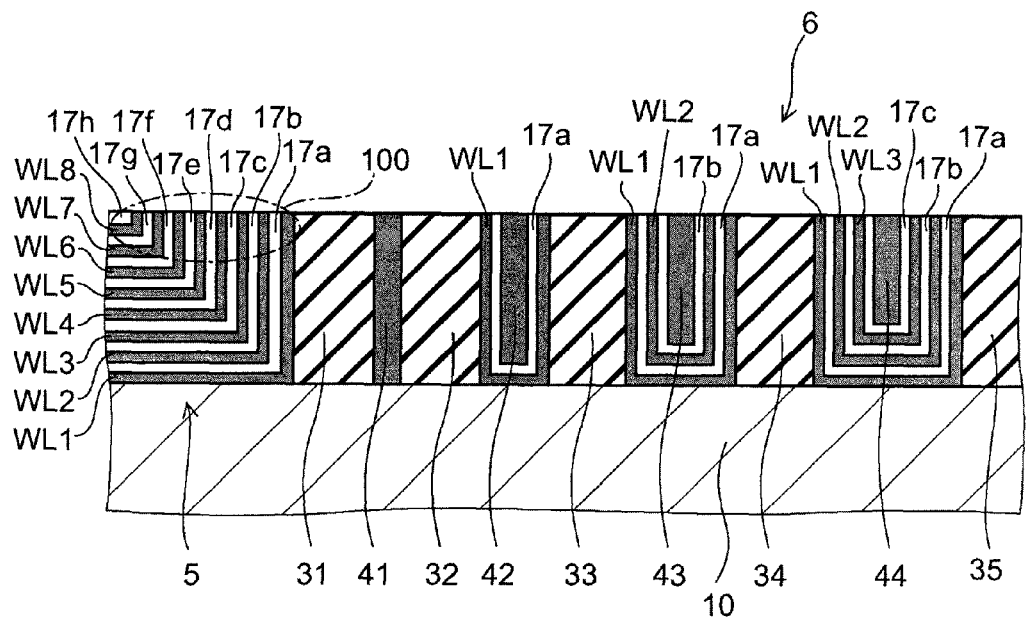
FIGS. 5A and 5B are schematic cross-sectional views in order of the processes, continuing from FIG. 4.

Next, the conductive layers WL1-WL8 and the insulating layers 17a-17h stacked on the upper surface of the wall portions 31-35 in the contact region 6 are polished away illustratively by the CMP (chemical mechanical polishing) process. This CMP process is performed until the upper surface of the wall portions 31-35 is exposed, and the structure shown in FIG. 5A is obtained. By this CMP process, the upper surface of each of the contact layers 41-44, . . . provided between the wall portions is also exposed.

The height of the wall portions 31-35 is generally equal to or larger than the thickness of the stacked body of the conductive layers WL1-WL8 and the insulating layers 17a-17h stacked in the memory cell region 5. Hence, the stacked body in the memory cell region 5 is not polished. That is, the stacked body composed of eight conductive layers WL1-WL8 and eight insulating layers 17a-17h is maintained in the memory cell region 5.

In the case where the height of the wall portions 31-35 is larger than the thickness of the stacked body in the memory cell region 5, the structure in the contact region 6 may be overpolished during the aforementioned polishing so that the upper surfaces of the wall portions 31-35 and the contact layers 41-44, . . . are aligned with the upper surface of the stacked body in the memory cell region 5.

As shown in FIG. 4, each of the contact layers 41-44, . . . is connected to each of the corresponding conductive layers WL1-WL8 in the memory cell region 5 through each of the conductive layers WL1-WL8 provided above the wall portions 31-35. This connection is broken by the aforementioned polishing.

However, because the wall portions 31-35 have a height equivalent to or larger than the thickness of the stacked body in the memory cell region 5, each of the contact layers 41-44, . . . is connected, as shown in FIG. 7, to each of the corresponding conductive layers WL1-WL8 opposed to the side surface of the wall portions 31-35 through the open ends at both ends (upper and lower end in FIG. 7) of the space between the wall portions. Each of the conductive layers WL1-WL8 opposed to the side surface of the wall portions 31-35 is formed integrally with each of the corresponding conductive layers WL1-WL8 in the memory cell region 5. Each of the conductive layers WL1-WL8 opposed to the side surface of the wall portions 31-35 is connected to each of the corresponding conductive layers WL1-WL8 in the memory cell region 5 so as to be bent upward from each end portion of the conductive layers WL1-WL8 in the memory cell region 5. Hence, each contact layer 41-44, . . . is electrically connected to each of the corresponding conductive layers WL1-WL8 in the memory cell region 5.

Figure 5B:
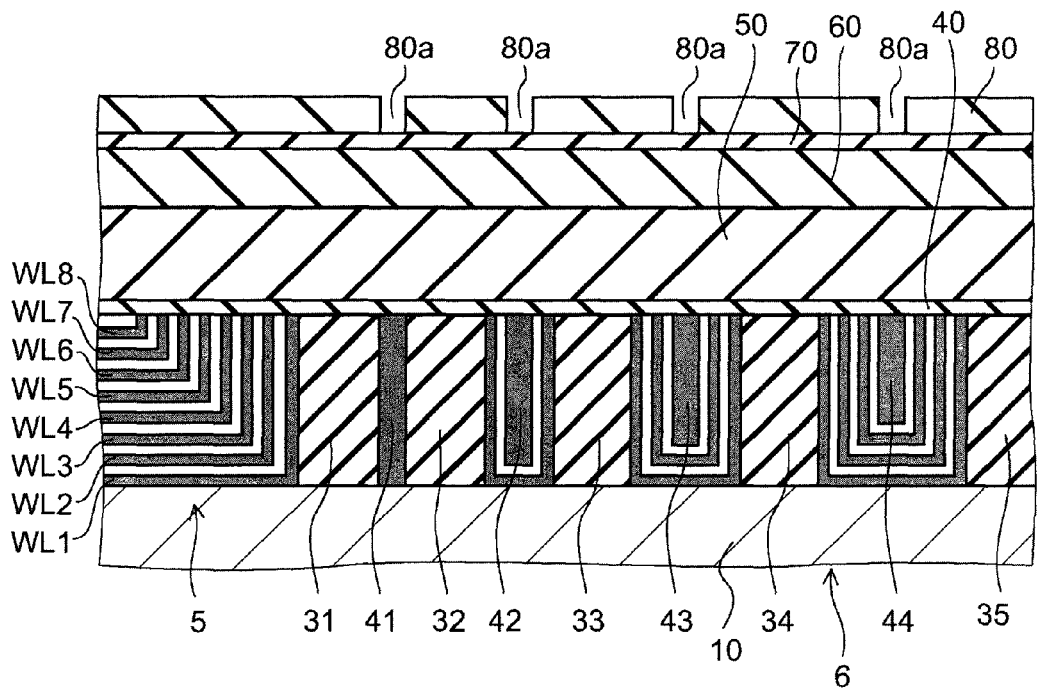

Next, as shown in FIG. 5B, a stopper film 40, an interlayer insulating film 50, a lower organic film 60, an oxide film 70, and a resist 80 are sequentially provided on the structure obtained in FIG. 5A. Then, the resist 80 is patterned to form desired openings 80a, and then used as a mask to sequentially etch the oxide film 70, the lower organic film 60, the interlayer insulating film 50, and the stopper film 40.

Thus, as shown in FIG. 6A, contact holes 51-54 penetrating through the interlayer insulating film 50 and the stopper film 40 are formed. Each of the contact holes 51-54 is formed on each of the corresponding contact layers 41-44, and the upper surface of each of the contact layers 41-44 is exposed into each of the contact holes 51-54. The width of each of the contact holes 51-54 is 2A, equal to the width of each of the contact layers 41-44.

Because the heights of each of the wall portions 31-35 from the surface of the base body 10 are equal, the upper surfaces of each of the contact layers 41-44 provided between each of the wall portions 31-35 can be aligned at the same height. Thus, the depths of each of the contact holes 51-54 can be made equal, which facilitates processing.

Contact electrodes 61-64 are provided in each of the contact holes 51-54 as shown in FIG. 6B. Thus, each of the conductive layers WL1-WL8 in the memory cell region 5 is electrically connected to a word line, not shown, through the contact layers 41-44, the contact electrodes 61-64 and the like. The word line is connected to a driver, not shown, which applies a desired potential to each of the conductive layers WL1-WL8 through the word line, the contact electrodes 61-64, the contact layers 41-44 and the like.

In FIG. 5A, even by providing only one wall portion 31, for instance, each of the conductive layers WL1-WL8 can be bent upward along the memory cell region 5 side of the wall portion 31 to obtain a structure 100 in which each of the conductive layers WL1-WL8 are extracted up to the same surface. However, in this case, the width of the portion functioning as a contact layer is equal to the thickness for one layer of each of the conductive layers WL1-WL8. In particular, in the case where the thickness for one layer of the conductive layers WL1-WL8 is thinned to increase the number of layers for higher storage capacity, the thinning of each of the conductive layers WL1-WL8 also results in decreasing the width of the contact layer, which makes it difficult to accurately form a fine contact hole thereabove. Furthermore, the spacing between the contact layers is also only the thickness for one layer of each of the insulating layers 17a-17h. Hence, there is concern about short circuit between contact electrodes provided in adjacent contact holes.

In contrast, in this embodiment, as described above, as many pairs of wall portions 31-35 are provided as the number of conductive layers WL1-WL8, and the spacings between the wall portions 31-35 are appropriately set. Thus, the columnar contact layers 41-44 having a width larger than the thickness for one layer of the conductive layers WL1-WL8 can be formed between each of the wall portions 31-35. Even if the contact layers 41-44 are formed simultaneously with the conductive layers WL1-WL8 in the memory cell region 5, the width of each of the contact holes 51-54 is not limited to the thickness for one layer of the conductive layers WL1-WL8, and does not increase the difficulty of the process for forming contact holes. Furthermore, increase in the cross-sectional area of the contact layers 41-44 serves for resistance reduction.

Furthermore, between adjacent contact layers, one wall portion, one or more conductive layers, and one or more insulating layers are provided. Thus, the spacing between adjacent contact electrodes is sufficiently wider than the thickness for one layer of the insulating layers 17a-17h, causing no concern about short circuit between the adjacent contact electrodes.

The wall portions 31 and 32 are insulators. Hence, it is also possible to expand the contact hole 51 to a region above the wall portions 31 and 32 so that a wider contact electrode 61 is provided therein. This serves for the resistance reduction of the contact electrode 61.

The contact hole 52 can also be expanded to a region above the insulating layer 17a sandwiching the contact layer 42. This applies similarly to other contact holes 53, 54, as long as the contact hole does not expand onto a conductive layer outside the insulating layer sandwiching the contact layer and cause the contact electrode to short-circuit with other conductive layers.

The wall portions 31-35 are not limited to being made of insulators, but may have a structure in which, for instance, silicon or other semiconductor is covered with an insulating film.

Next, another example of the contact structure of the conductive layers WL1-WL8 in this embodiment is described with reference to FIGS. 8A and 9B.

Figure 8A:
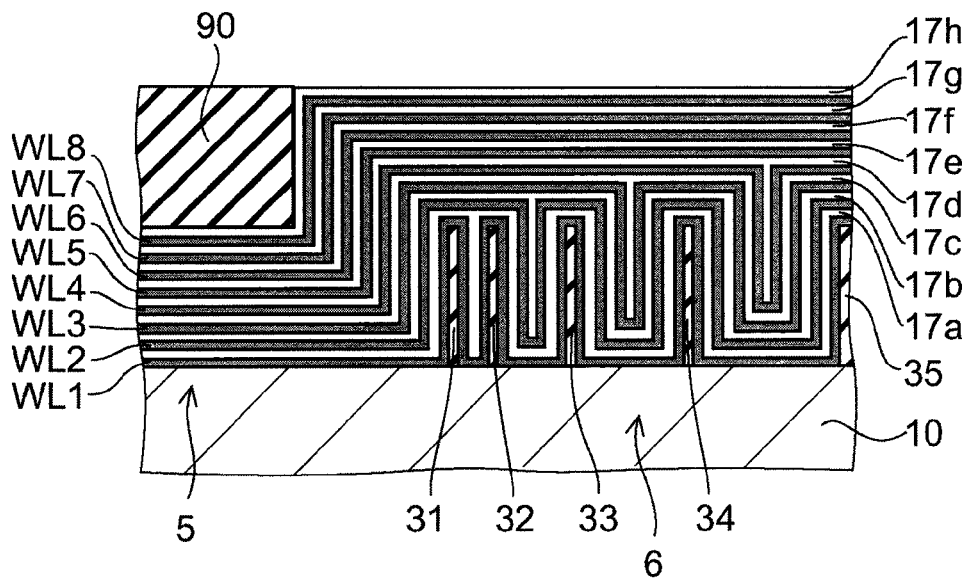
FIGS. 8A and 8B are schematic cross-sectional views illustrating another method for forming the contact structure according to the embodiment of the invention.

Also in this example, as shown in FIG. 8A, the wall portions 31-35 are provided in the contact region 6. Although only four pairs of the wall portions 31-35 are shown in FIG. 8A, eight pairs of wall portions, which are as many pairs as the number of the conductive layers WL1-WL8 provided in the memory cell region 5, are provided in the contact region 6.

In this example, the spacings between each of the wall portions 31-35 are set as follows. The thickness of each of the conductive layers WL1-WL8 formed in the memory cell region 5 is denoted by A, and the thickness of each of the insulating layers 17a-17h is denoted by B. Then, the spacings between each of the wall portions 31-35 is set to $2A+aB+(n-1)\times 2(A+B)$ ($0<a<2$, $n=1, 2, \ldots, 8$). The spacing of $n=1$ is the narrowest, and the spacing of $n=8$ is the widest.

The spacing between the wall portion 31 and the wall portion 32, which is the narrowest, is $2A+aB$ from the above relation for $n=1$. The other spacings between the wall portions are wider than $2A+aB$. For instance, the spacing between the wall portion 32 and the wall portion 33 is $2A+aB+2(A+B)$ from the above relation for $n=2$, and the spacing between the wall portion 33 and the wall portion 34 is $2A+aB+4(A+B)$ from the above relation for $n=3$.

After the wall portions 31-35 are formed, the conductive layers WL1-WL8 and the insulating layers 17a-17h are alternately stacked on the base body 10. The conductive layers WL1-WL8 and the insulating layers 17a-17h are formed illustratively by the CVD process.

First, the lowermost (first) conductive layer WL1 is formed. When the conductive layer WL1 is formed in the memory cell region 5, the conductive layer WL1 is formed in the contact region 6 so as to cover the wall portions 31-35. That is, the upper surface, the opposed surface, which is opposed to the other wall portions, and the side surface (other than the opposed surface) of each of the wall portions 31-35 are covered with the conductive layer WL1. The thickness of the conductive layer WL1 covering the wall portions 31-35 is generally equal to the thickness of the conductive layer WL1 formed in the memory cell region 5.

After the first conductive layer WL1 is formed, a first insulating layer 17a is formed thereon. Also in the contact region 6, the insulating layer 17a is formed so as to cover the conductive layer WL1. The thickness of the insulating layer 17a covering the conductive layer WL1 in the contact region 6 is generally equal to the thickness of the insulating layer 17a formed in the memory cell region 5. Here, the gap between the conductive layers WL1 opposed between the wall portion 31 and the wall portion 32 is filled with the insulating layer 17a.

After the first insulating layer 17a is formed, a second conductive layer WL2 is formed thereon. Also in the contact region 6, the conductive layer WL2 is formed so as to cover the first insulating layer 17a. The thickness of the conductive layer WL2 covering the insulating layer 17a in the contact region 6 is generally equal to the thickness of the conductive layer WL2 formed in the memory cell region 5.

After the second conductive layer WL2 is formed, a second insulating layer 17b is formed thereon. Also in the contact region 6, the insulating layer 17b is formed so as to cover the second conductive layer WL2. The thickness of the insulating layer 17b covering the conductive layer WL2 in the contact region 6 is generally equal to the thickness of the insulating layer 17b formed in the memory cell region 5. Here, the gap between the conductive layers WL2 opposed between the wall portion 32 and the wall portion 33 is filled with the insulating layer 17b.

After the second insulating layer 17b is formed, a third conductive layer WL3 is formed thereon. Also in the contact region 6, the conductive layer WL3 is formed so as to cover the second insulating layer 17b. The thickness of the conductive layer WL3 covering the insulating layer 17b in the contact region 6 is generally equal to the thickness of the conductive layer WL3 formed in the memory cell region 5.

After the third conductive layer WL3 is formed, a third insulating layer 17c is formed thereon. Also in the contact region 6, the insulating layer 17c is formed so as to cover the third conductive layer WL3. The thickness of the insulating layer 17c covering the conductive layer WL3 in the contact region 6 is generally equal to the thickness of the insulating layer 17c formed in the memory cell region 5. Here, the gap between the conductive layers WL3 opposed between the wall portion 33 and the wall portion 34 is filled with the insulating layer 17c.

After the third insulating layer 17c is formed, a fourth conductive layer WL4 is formed thereon. Also in the contact region 6, the conductive layer WL4 is formed so as to cover the third insulating layer 17c. The thickness of the conductive layer WL4 covering the insulating layer 17c in the contact region 6 is generally equal to the thickness of the conductive layer WL4 formed in the memory cell region 5.

After the fourth conductive layer WL4 is formed, a fourth insulating layer 17d is formed thereon. Also in the contact region 6, the insulating layer 17d is formed so as to cover the fourth conductive layer WL4. The thickness of the insulating layer 17d covering the conductive layer WL4 in the contact region 6 is generally equal to the thickness of the insulating layer 17d formed in the memory cell region 5. Here, the gap between the conductive layers WL4 opposed between the wall portion 34 and the wall portion 35 is filled with the insulating layer 17d.

Subsequently, in a similar manner, a fifth conductive layer WL5, a fifth insulating layer 17e, a sixth conductive layer WL6, a sixth insulating layer 17f, a seventh conductive layer WL7, a seventh insulating layer 17g, an eighth conductive layer WL8, and an eighth insulating layer 17h are sequentially formed, and the structure shown in FIG. 8A is obtained.

A step difference is formed between the stacked body in the memory cell region 5 and the stacked body on the wall portions 31-35. An organic film 90 is provided on the stacked body in the memory cell region 5 so as to fill the step difference.

Figure 8B:
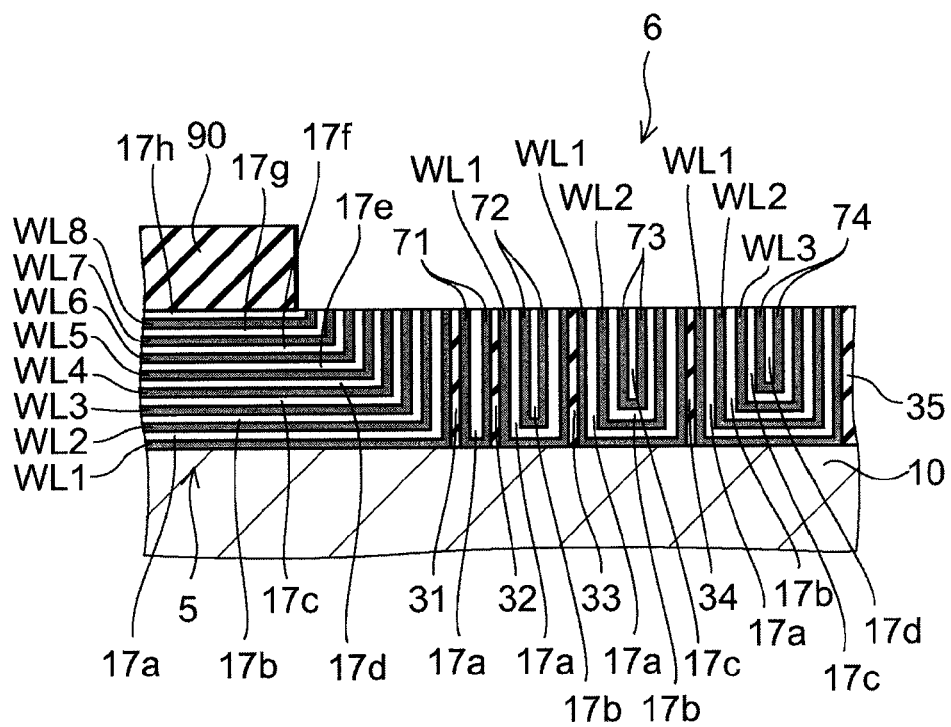

Next, as shown in FIG. 8B, etchback is performed until the upper surface of the wall portions 31-35 is exposed. The stacked body in the memory cell region 5 is protected by the organic film 90, and the stacked body composed of eight conductive layers WL1-WL8 and eight insulating layers 17a-17h is maintained in the memory cell region 5.

The upper surface of the conductive layer WL1 provided between the wall portion 31 and the wall portion 32 and having a U-shaped cross section is exposed, and this conductive layer WL1 functions as a contact layer 71. The contact layer 71 is formed like a column extending along the height of the wall portions 31 and 32 and having a U-shaped cross section.

The upper surface of the conductive layer WL2 provided between the wall portion 32 and the wall portion 33 and having a U-shaped cross section is exposed, and this conductive layer WL2 functions as a contact layer 72. The contact layer 72 is formed like a column extending along the height of the wall portions 32 and 33 and having a U-shaped cross section.

The upper surface of the conductive layer WL3 provided between the wall portion 33 and the wall portion 34 and having a U-shaped cross section is exposed, and this conductive layer WL3 functions as a contact layer 73. The contact layer 73 is formed like a column extending along the height of the wall portions 33 and 34 and having a U-shaped cross section.

The upper surface of the conductive layer WL4 provided between the wall portion 34 and the wall portion 35 and having a U-shaped cross section is exposed, and this conductive layer WL4 functions as a contact layer 74. The contact layer 74 is formed like a column extending along the height of the wall portions 34 and 35 and having a U-shaped cross section. Furthermore, although not shown, the conductive layers WL5-WL8 each functioning as a contact layer and shaped like a column having a U-shaped cross section are formed between the corresponding wall portions.

Before the etchback, each of the contact layers 71-74, . . . is connected to each of the corresponding conductive layers WL1-WL8 in the memory cell region 5 through each of the conductive layers WL1-WL8 provided above the wall portions 31-35. This connection is broken by the aforementioned etch back.

However, also in this example, like the aforementioned example shown in FIG. 7, each of the contact layers 71-74, . . . is connected to each of the corresponding conductive layers WL1-WL8 opposed to the side surface of each of the wall portions 31-35 through the open ends at both ends of the space between the wall portions. Each of the conductive layers WL1-WL8 opposed to the side surface of each of the wall portions 31-35 is formed integrally with and connected to each of the corresponding conductive layers WL1-WL8 in the memory cell region 5. Hence, each of the contact layers 71-74, . . . is electrically connected to each of the corresponding conductive layers WL1-WL8 in the memory cell region 5.

Next, after the organic film 90 on the memory cell region 5 is removed, a stopper film 40, an interlayer insulating film 50, a lower organic film 60, an oxide film 70, and a resist 80 are sequentially provided like the aforementioned example shown in FIG. 5B. Then, the resist 80 is used as a mask to sequentially etch the oxide film 70, the lower organic film 60, the interlayer insulating film 50, and the stopper film 40.

Figure 9A:
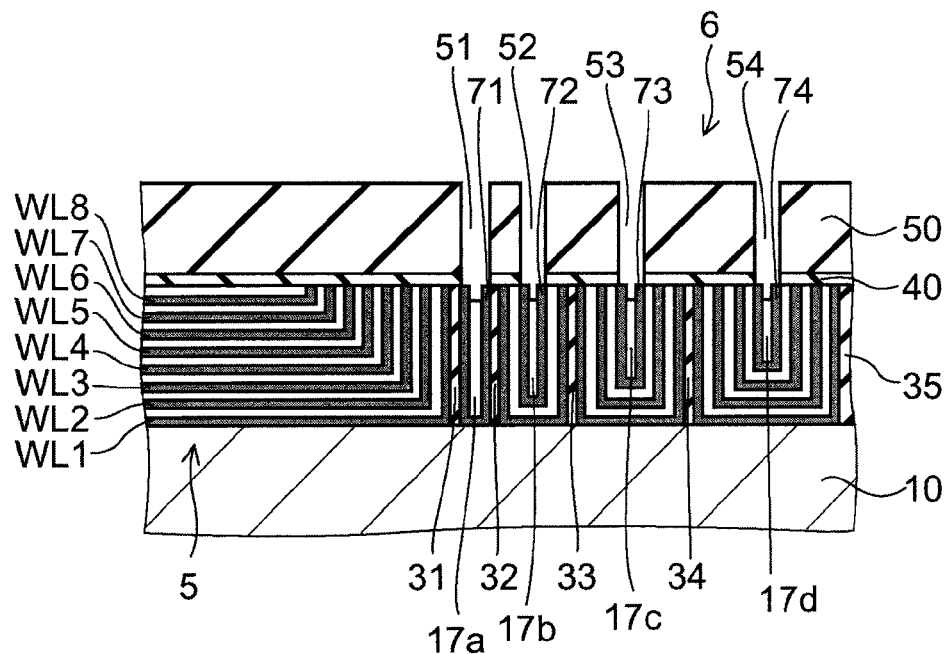
FIGS. 9A and 9B are schematic cross-sectional views in order of the processes, continuing from FIG. 8B.
Figure 9B:
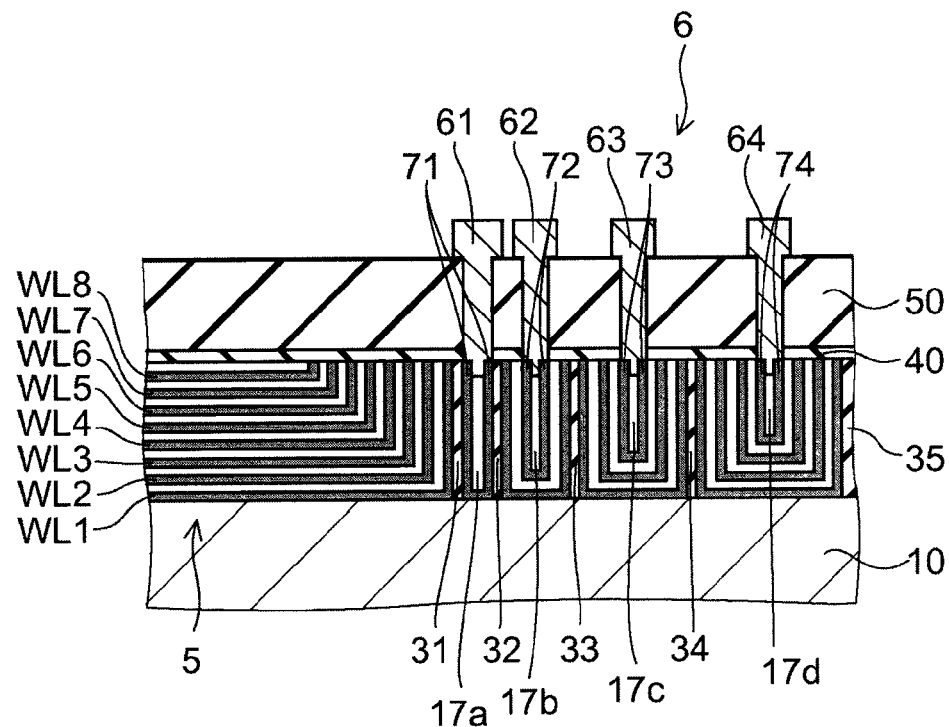

Thus, as shown in FIG. 9A, contact holes 51-54 penetrating through the interlayer insulating film 50 and the stopper film 40 are formed. The contact hole 51 is formed on the contact layer 71 and the insulating layer 17a provided inside the contact layer 71. The contact hole 52 is formed on the contact layer 72 and the insulating layer 17b provided inside the contact layer 72. The contact hole 53 is formed on the contact layer 73 and the insulating layer 17c provided inside the contact layer 73. The contact hole 54 is formed on the contact layer 74 and the insulating layer 17d provided inside the contact layer 74. Contact electrodes 61-64 are provided in each of the contact holes 51-54 as shown in FIG. 9B.

The upper surface of the contact layer 71 is in contact with the contact electrode 61, and the conductive layer WL1 in the memory cell region 5 is electrically connected to the contact electrode 61 through the contact layer 71. Furthermore, an upper portion of the insulating layer 17a inside the contact layer 71 can be etched away to expose the side surface of an upper portion of the contact layer 71 so that the contact electrode 61 can be brought into contact with that side surface as well. This serves to reduce contact resistance between the contact layer 71 and the contact electrode 61.

Likewise, the upper surface of the contact layer 72 is in contact with the contact electrode 62, and the conductive layer WL2 in the memory cell region 5 is electrically connected to the contact electrode 62 through the contact layer 72. Furthermore, an upper portion of the insulating layer 17b inside the contact layer 72 can be etched away to expose the side surface of an upper portion of the contact layer 72 so that the contact electrode 62 can be brought into contact with that side surface as well. This serves to reduce contact resistance between the contact layer 72 and the contact electrode 62.

Likewise, the upper surface of the contact layer 73 is in contact with the contact electrode 63, and the conductive layer WL3 in the memory cell region 5 is electrically connected to the contact electrode 63 through the contact layer 73. Furthermore, an upper portion of the insulating layer 17c inside the contact layer 73 can be etched away to expose the side surface of an upper portion of the contact layer 73 so that the contact electrode 63 can be brought into contact with that side surface as well. This serves to reduce contact resistance between the contact layer 73 and the contact electrode 63.

Likewise, the upper surface of the contact layer 74 is in contact with the contact electrode 64, and the conductive layer WL4 in the memory cell region 5 is electrically connected to the contact electrode 64 through the contact layer 74. Furthermore, an upper portion of the insulating layer 17d inside the contact layer 74 can be etched away to expose the side surface of an upper portion of the contact layer 74 so that the contact electrode 64 can be brought into contact with that side surface as well. This serves to reduce contact resistance between the contact layer 74 and the contact electrode 64.

Likewise, the other conductive layers WL5-WL8 are also each electrically connected to a contact electrode through a contact layer provided between the corresponding wall portions.

Inside each contact layer is provided an insulating layer, which is stacked immediately above the conductive layer connected to the contact layer in the memory cell region. For instance, inside the contact layer 71 is provided the insulating layer 17a, which is stacked immediately above the conductive layer WL1 connected to this contact layer 71.

In this example, each of the contact holes 51-54 is formed on the region having a width, which is equal to the sum of the thickness of two layers of each of the conductive layers WL1-WL8 formed in the memory cell region 5 and the thickness of each of the corresponding insulating layers 17a-17h filling in each of the corresponding U-shaped conductive layers WL1-WL8 in the contact region 6. That is, also in this example, while the contact layers 71-74 are formed simultaneously with the conductive layers WL1-WL8 in the memory cell region 5, the width of each of the contact holes 51-54 is not limited to the thickness for one layer of the conductive layers WL1-WL8, and does not increase the difficulty of the process for forming contact holes.

Furthermore, also between adjacent contact layers is provided a structure having a width larger than the thickness for one layer of each of the conductive layers WL1-WL8 and the thickness for one layer of each of the insulating layers 17a-17h, hence causing no concern about short circuit between adjacent contact electrodes.

Figure 10:
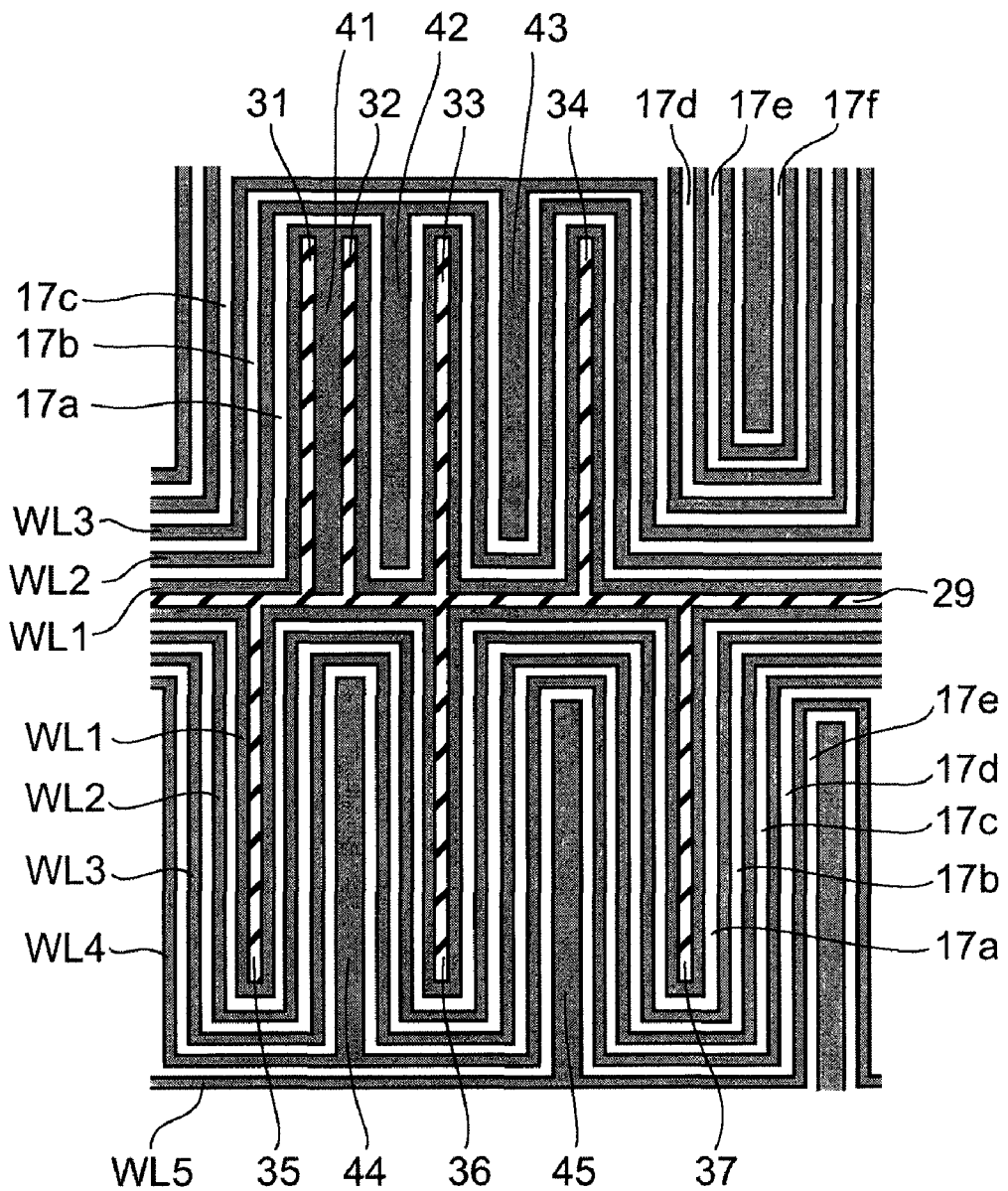
FIG. 10 is a plan view of a planar pattern of the contact structure according to the embodiment of the invention.
Figure 11:
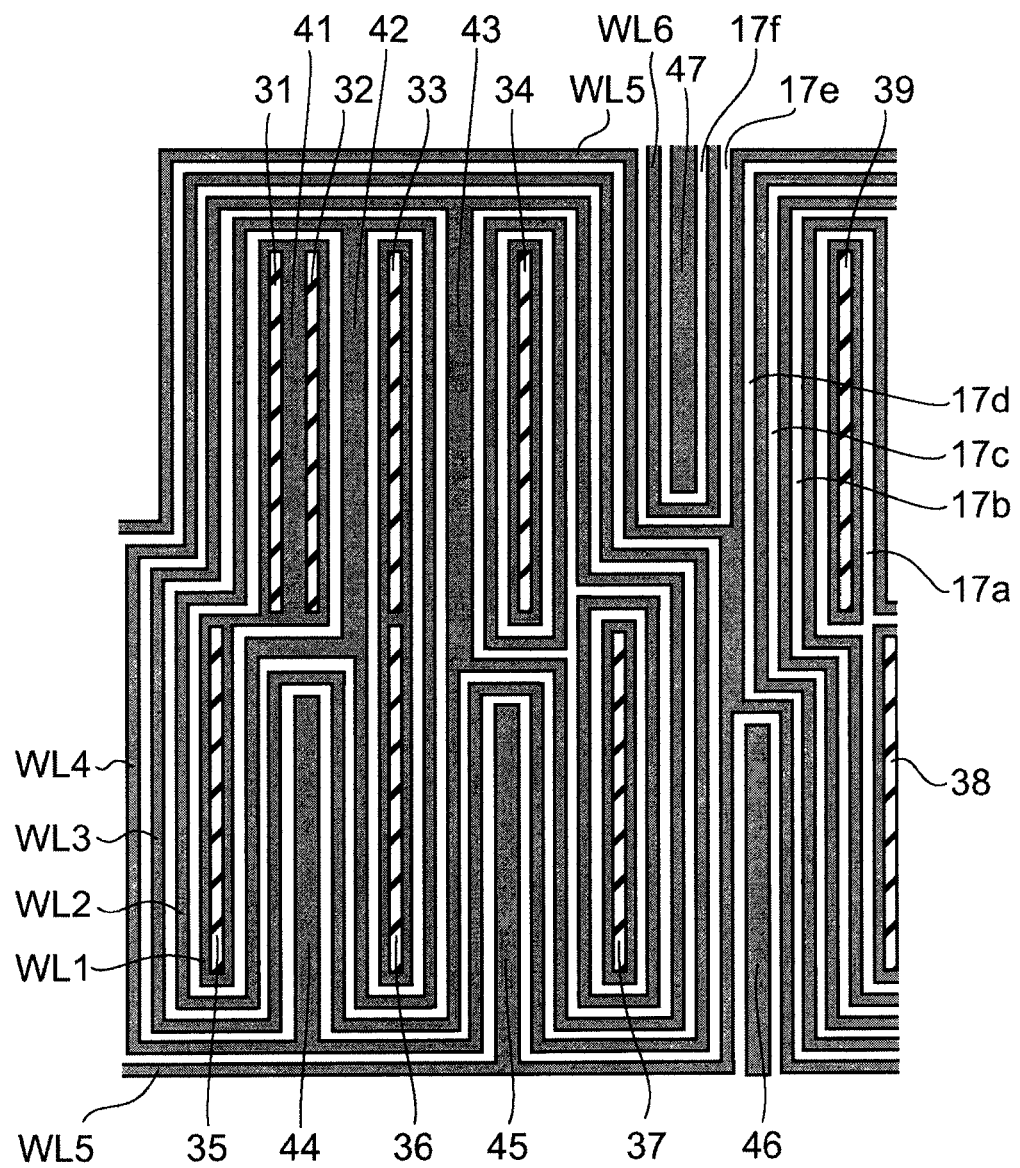
FIG. 11 is a plan view of another planar pattern of the contact structure according to the embodiment of the invention.

As shown in FIGS. 10 and 11, a plurality of wall portions can also be arranged in two directions along the width and length of the wall portions. FIGS. 10 and 11 show example planar patterns of the contact structure, corresponding to the plan view of FIG. 7.

FIG. 10 illustratively shows five pairs of wall portions 31-37. The wall portion 31 and the wall portion 32 are opposed generally in parallel, and the spacing between these wall portions 31 and 32 is wider than the thickness A for one layer of the conductive layers WL1-WL8 in the memory cell region, and is illustratively set to 2A. A contact layer 41 connected to the first lowest conductive layer WL1 in the memory cell region is provided between the wall portion 31 and the wall portion 32.

The wall portion 32 and the wall portion 33 are opposed generally in parallel, and the spacing between these wall portions 32 and 33 is wider than the spacing between the wall portions 31 and 32. A contact layer 42 connected to the second lowest conductive layer WL2 in the memory cell region is provided midway along the width between the wall portion 32 and the wall portion 33.

The wall portion 33 and the wall portion 34 are opposed generally in parallel, and the spacing between these wall portions 33 and 34 is wider than the spacing between the wall portions 32 and 33. A contact layer 43 connected to the third lowest conductive layer WL3 in the memory cell region is provided midway along the width between the wall portion 33 and the wall portion 34.

The wall portion 35 and the wall portion 36 are opposed generally in parallel, and the spacing between these wall portions 35 and 36 is wider than the spacing between the wall portions 33 and 34. A contact layer 44 connected to the fourth lowest conductive layer WL4 in the memory cell region is provided midway along the width between the wall portion 35 and the wall portion 36.

The wall portion 36 and the wall portion 37 are opposed generally in parallel, and the spacing between these wall portions 36 and 37 is wider than the spacing between the wall portions 35 and 36. A contact layer 45 connected to the fifth lowest conductive layer WL5 in the memory cell region is provided midway along the width between the wall portion 36 and the wall portion 37.

Furthermore, a wall portion 29 extending generally orthogonal to the longitudinal direction of the wall portions 31-37 is provided. One longitudinal end of each of the wall portions 31-37 is joined to the wall portion 29. The wall portions 31-34 and the wall portions 35-37 extend in opposite directions across the wall portion 29.

The space between the opposed wall portions has an open end at the other ends of each of the wall portions 31-37 not joined to the wall portion 29. Hence, through that open end, each of the contact layers 41-45 provided between each of the corresponding wall portions 31-37 is connected to each of the corresponding conductive layers WL1-WL5 in the memory cell region.

FIG. 11 illustratively shows seven pairs of wall portions 31-39. The wall portion 31 and the wall portion 32 are opposed generally in parallel, and the spacing between these wall portions 31 and 32 is wider than the thickness A for one layer of the conductive layers WL1-WL8 in the memory cell region, and is illustratively set to 2A. A contact layer 41 connected to the first lowest conductive layer WL1 in the memory cell region is provided between the wall portion 31 and the wall portion 32.

The wall portion 32 and the wall portion 33 are opposed generally in parallel, and the spacing between these wall portions 32 and 33 is wider than the spacing between the wall portions 31 and 32. A contact layer 42 connected to the second lowest conductive layer WL2 in the memory cell region is provided midway along the width between the wall portion 32 and the wall portion 33.

The wall portion 33 and the wall portion 34 are opposed generally in parallel, and the spacing between these wall portions 33 and 34 is wider than the spacing between the wall portions 32 and 33. A contact layer 43 connected to the third lowest conductive layer WL3 in the memory cell region is provided midway along the width between the wall portion 33 and the wall portion 34.

The wall portion 35 and the wall portion 36 are opposed generally in parallel, and the spacing between these wall portions 35 and 36 is wider than the spacing between the wall portions 33 and 34. A contact layer 44 connected to the fourth lowest conductive layer WL4 in the memory cell region is provided midway along the width between the wall portion 35 and the wall portion 36.

The wall portion 36 and the wall portion 37 are opposed generally in parallel, and the spacing between these wall portions 36 and 37 is wider than the spacing between the wall portions 35 and 36. A contact layer 45 connected to the fifth lowest conductive layer WL5 in the memory cell region is provided midway along the width between the wall portion 36 and the wall portion 37.

The wall portion 37 and the wall portion 38 are opposed generally in parallel, and the spacing between these wall portions 37 and 38 is wider than the spacing between the wall portions 36 and 37. A contact layer 46 connected to the sixth lowest conductive layer WL6 in the memory cell region is provided midway along the width between the wall portion 37 and the wall portion 38.

The wall portion 34 and the wall portion 39 are opposed generally in parallel, and the spacing between these wall portions 34 and 39 is wider than the spacing between the wall portions 37 and 38. A contact layer 47 connected to the seventh lowest conductive layer WL7 in the memory cell region is provided midway along the width between the wall portion 34 and the wall portion 39.

Both longitudinal ends of the space between the opposed wall portions are open ends. Hence, through those open ends, each of the contact layers 41-47 provided between each of the corresponding wall portions 31-39 is connected to each of the corresponding conductive layers WL1-WL7 in the memory cell region.

The embodiment of the invention has been described with reference to examples. However, the invention is not limited thereto, but can be variously modified within the spirit of the invention.

The shape of the silicon pillar in the memory cell array is not limited to a cylinder, but can be a prism. Furthermore, the invention is not limited to completely filling in the memory hole with a silicon pillar. As an alternative structure, a silicon film can be formed in a tubular shape only at the portion in contact with the insulating film including the charge storage layer, and an insulator can be buried inside it. Furthermore, the insulating film structure between the conductive layer and the silicon pillar is not limited to the ONO (oxide-nitride-oxide) structure, but can be a two-layer structure of a charge storage layer and a gate insulating film, for instance.

The invention claimed is:

1. A semiconductor device comprising:
   a base body;
   a stacked body including a conductive layer and an insulating layer alternately stacked on the base body;
   a pair of wall portions formed on the base body with a height equivalent to or larger than a thickness of the stacked body and opposed with a spacing wider than a thickness for one layer of the conductive layer;
   a contact layer interposed between the wall portions and connected to the conductive layer in the stacked body through a lateral open end between the wall portions; and
   a contact electrode provided on the contact layer and connected to the contact layer.

2. The device according to claim 1, wherein
   the stacked body includes two or more layers of the conductive layer and two or more layers of the insulating layer,
   a plurality of pairs of the wall portions are formed with different spacings therebetween, and
   with a larger spacing between the wall portions, the contact layer provided between the wall portions is connected to an upper one of the conductive layer in the stacked body.

3. The device according to claim 2, wherein the wall portions have a generally equal height from a surface of the base body.

4. The device according to claim 2, wherein one of the wall portions, one or more layers of the conductive layer, and one or more layers of the insulating layer are provided between adjacent ones of the contact layer.

5. The device according to claim 2, wherein the wall portions are arranged in two directions along length and width of each of the wall portions.

6. The device according to claim 1, wherein the wall portions are made of an insulator.

7. The device according to claim 1, wherein the contact layer is provided like a column extending along the height direction of the wall portions.

8. The device according to claim 1, wherein the contact layer has a U-shaped cross section.

9. The device according to claim 8, wherein the insulating layer is provided inside the contact layer having the U-shaped cross section.

10. The device according to claim 9, wherein
    an inner side surface of an upper portion of the contact layer is exposed from the insulating layer, and
    the contact electrode is in contact with an upper surface and the side surface of the contact layer.

11. The device according to claim 1, wherein the conductive layer and the contact layer are formed integrally from the same material.

12. The device according to claim 1, further comprising:
    a stopper film provided on an upper surface of a structure including the wall portions and the contact layer; and
    an interlayer insulating film provided on the stopper film and made of a material different from the stopper film,
    the contact electrode being provided in a contact hole which penetrates through the interlayer insulating film and the stopper film to the contact layer.

13. The device according to claim 1, further comprising:
    a semiconductor layer provided inside a memory hole penetrating through the stacked body, and extending in a stacking direction of the conductive layer and the insulating layer; and a charge storage layer provided between the conductive layer and the semiconductor layer.

14. The device according to claim 13, wherein a first insulating film is provided on a sidewall of the memory hole, the charge storage layer is provided inside the first insulating film, a second insulating film is provided inside the charge storage layer, and the semiconductor layer is provided inside the second insulating film.

* * * * *